United States Patent
Yeh

(10) Patent No.: US 8,524,424 B2
(45) Date of Patent: Sep. 3, 2013

(54) OPTICAL PROXIMITY CORRECTION PHOTOMASK

(75) Inventor: Kwei-Tin Yeh, Taichung (TW)

(73) Assignee: Windbond Electronics Corp., Taichung (TW)

( * ) Notice: Subject to any disclaimer, the term of this patent is extended or adjusted under 35 U.S.C. 154(b) by 190 days.

(21) Appl. No.: 13/277,550

(22) Filed: Oct. 20, 2011

(65) Prior Publication Data

US 2013/0101924 A1    Apr. 25, 2013

(51) Int. Cl.
*G03F 1/36*    (2012.01)

(52) U.S. Cl.
USPC ............................................................ 430/5

(58) Field of Classification Search
USPC .............................. 430/5, 311, 312, 322, 323
See application file for complete search history.

(56) References Cited

U.S. PATENT DOCUMENTS

| 6,238,825 | B1 | 5/2001 | Lin |
| 6,905,899 | B2 * | 6/2005 | Yang ............................... 438/22 |

* cited by examiner

*Primary Examiner* — Stephen Rosasco
(74) *Attorney, Agent, or Firm* — Muncy, Geissler, Olds & Lowe, PLLC

(57) ABSTRACT

An optical proximity correction (OPC) photomask is provided. The photomask includes two opening patterns and a pair of scattering bar patterns. The two patterns are arranged on a substrate along a first direction and separated from each other by a predetermined distance. The pair of scattering bar patterns is arranged on the substrate along a second direction perpendicular to the first direction and adjacent to two opposing sides of each opening pattern. Each scattering bar pattern does not overlap with the opening patterns on the first and second directions as viewed from a cross sectional perspective. A phase shift of 180° exists between each opening pattern and each scattering bar pattern.

10 Claims, 7 Drawing Sheets

OPTICAL PROXIMITY CORRECTION PHOTOMASK

BACKGROUND OF THE INVENTION

1. Field of the Invention

The invention relates to photolithography technology, and in particular to an optical proximity correction (OPC) photomask for fabrication of contact holes.

2. Description of the Related Art

In the fabrication of semiconductor devices, patterns corresponding to various features (e.g., contact holes) are typically transferred from a photomask used in the photolithography process onto a photoresist on a silicon wafer. Thereafter, the feature patterns are transferred to the silicon wafer by an etching process. However, due to diffraction or other causes, the feature patterns on the photomask cannot successfully be imprinted onto the photoresist, resulting in increasing difficulty for feature fabrication. Accordingly, one of the goals in semiconductor device fabrication is to precisely reproduce original designed patterns onto the photoresist on the wafer by the photomask.

Currently, several OPC photomask have been developed, such that the original designed patterns can be precisely transferred onto the photoresist. A common OPC photomask, which is widely known, has sub-resolution scattering bars. Since the scattering bar patterns on the OPC photomask are so thin, they cannot be transferred onto the photoresist after performing an exposure process, but can enhance pattern sharpness during the lithography process. For example, U.S. Pat. No. 6,238,825, discloses a photomask with alternating arrangements of scattering bars to enhance the resolution of photolithography by OPC.

However, the pattern size and pitch corresponding to the feature patterns are narrowing with the increase of integration of integrated circuits (ICs). As a result, the scattering bar patterns are becoming very close to the feature patterns (e.g., contact hole patterns) on the photomask, and thus the process window of the photomask is reduced and the adjacent imprinted patterns are easily linked together, such that the feature patterns cannot be successfully imprinted onto the photoresist.

Accordingly, there exists a need in the art for development of a novel OPC photomask, which is capable of eliminating the deficiencies mentioned above.

BRIEF SUMMARY OF THE INVENTION

A detailed description is given in the following embodiments with reference to the accompanying drawings. An exemplary embodiment of an optical proximity correction (OPC) photomask comprises two opening patterns and a pair of scattering bar patterns. The two openings are arranged on a substrate along a first direction and separated from each other by a predetermined distance. The pair of scattering bar patterns is arranged on the substrate along a second direction perpendicular to the first direction and adjacent to two opposing sides of each opening pattern. Each scattering bar pattern does not overlap with the opening patterns on the first and second directions as viewed from a cross sectional perspective. A phase shift of 180° exists between each opening pattern and each scattering bar pattern.

Another exemplary embodiment of an OPC photomask comprises a plurality of rectangular opening patterns and a plurality of pairs of scattering bar patterns. The plurality of rectangular opening patterns is arranged on a substrate along a first direction to define a plurality of spacing regions therebetween. The plurality of pairs of scattering bar patterns is respectively arranged on the substrate along a second direction perpendicular to the first direction, such that each pair of scattering bar patterns is adjacent to two opposing sides of a corresponding spacing region. Each scattering bar pattern does not overlap with the plurality of rectangular opening patterns on the first and second directions as viewed from a cross sectional perspective and a phase shift of 180° exists between each rectangular opening pattern and each scattering bar pattern.

BRIEF DESCRIPTION OF DRAWINGS

The invention can be more fully understood by reading the subsequent detailed description and examples with references made to the accompanying drawings, wherein.

DETAILED DESCRIPTION OF DISCLOSURE

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
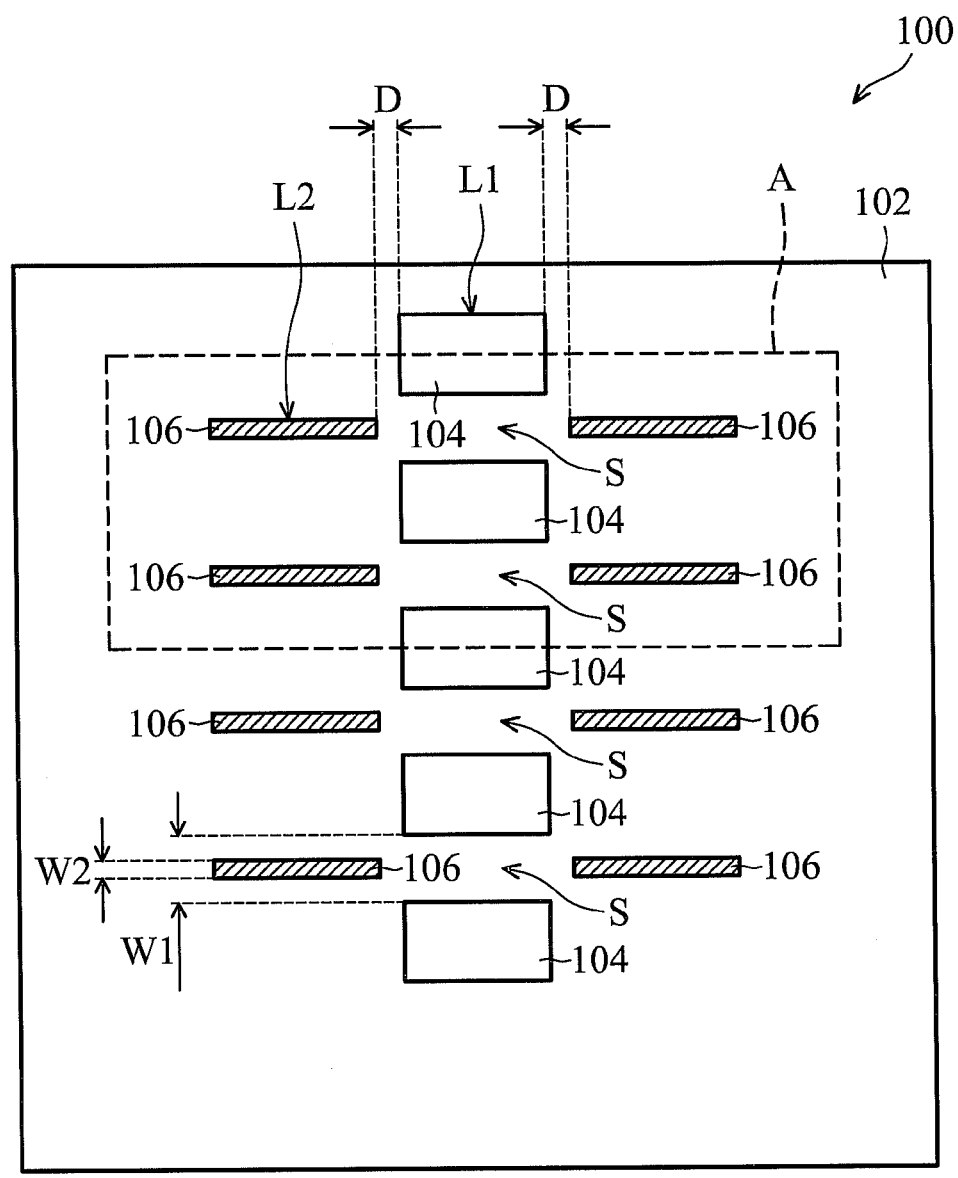
FIG. 1 is a plan view of an exemplary embodiment of an optical proximity correction (OPC) photomask according to the invention.

FIG. 1 illustrates a plan view of an exemplary embodiment of an OPC photomask 100 according to the invention. In the embodiment, the OPC photomask 100 is employed to fabricate a semiconductor feature pattern, such as a contact hole, and comprises a plurality of opening patterns 104 and a plurality of pairs of scattering bar patterns 106. The plurality of opening patterns 104 is arranged on a substrate 102 (e.g., quartz or glass) along a first direction 10, wherein the substrate 102 has an opaque material (e.g., chromium (Cr)) layer with the patterns deposited thereon, and the adjacent opening patterns 104 are separated from each other by a predetermined distance W1, thereby defining a plurality of spacing regions S between the plurality of opening patterns 104.

Each pair of scattering bar pattern 106 is arranged on the substrate 102 along a second direction 20 perpendicular to the first direction 10, such that each pair of scattering bar pattern 106 are adjacent to two opposing sides of a corresponding spacing region S and adjacent to two opposing sides of the opening patterns 104 defining the corresponding spacing region S.

Note that although there are five opening patterns 104 and four pairs of scattering bar patterns 106 shown in FIG. 1, and one of ordinary skill in the art can understand that the number of the opening patterns 104 is determined by design demands and the number of the pair of scattering bar patterns 106 is determined upon the number of the opening patterns 104. Namely, the OPC photomask 100 requires at least two opening patterns and a pair of scattering bar patterns (which is disposed adjacent to two opposing sides of each opening pattern) for OPC.

In particular, in the embodiment, each scattering bar pattern 106 does not overlap with the opening patterns 104 on the first direction 10 as viewed from a cross sectional perspective. Namely, no scattering bar pattern 106 exists within the spacing regions S. Moreover, each scattering bar pattern 106 does not overlap with the opening patterns 104 on the second direction 20 as viewed from a cross sectional perspective. Namely, the pair of scattering bar pattern 106 is disposed between the adjacent opening patterns 104 and outside of the corresponding spacing region S.

In such a configuration of the plurality of opening patterns 104 and the plurality of pairs of the scattering bar patterns 106, the opening patterns 104 and each scattering bar pattern 106 are arranged to define an edge-to-edge distance D, and the edge-to-edge distance D is in a range of 0 to 80 nm. Accordingly, since no scattering bars 106 is disposed near the edges of each opening pattern 104, the process window of the OPC photomask 100 is not reduced as the size and pitch of the opening patterns 104 are narrowed. In one embodiment, each opening pattern 104 is rectangular and has a long edge L1 parallel to a long edge L2 of each scattering bar pattern 106 and the second direction 20. Moreover, a ratio of a width W2 of each scattering bar pattern 106 to the predetermined distance W1 does not exceed 0.5.

Additionally, in particular, in the embodiment, a phase shift of 180° exists between each opening pattern 104 and each scattering bar pattern 106. For example, each opening pattern 104 has a phase of 0° and each scattering bar pattern 106 has a phase of 180°. In such a configuration of the plurality of opening patterns 104 and the plurality pairs of the scattering bar patterns 106, the light passing through the opening patterns 104 and passing through the scattering bar patterns 106 may induce interference effect, thereby reducing the light intensity at the edges of the opening pattern 104 and the edges of the spacing region S while the light intensity in the opening pattern 104 itself is not reduced. As a result, the profile of the opening patterns imprinted onto the photoresist by the OPC photomask 100 can be improved and the contrast in the photolithography process can be increased. Additionally, in some embodiments, each opening pattern 104 may have a phase of 180° and each scattering bar pattern 106 may have a phase of 0°.

Figure 2A:
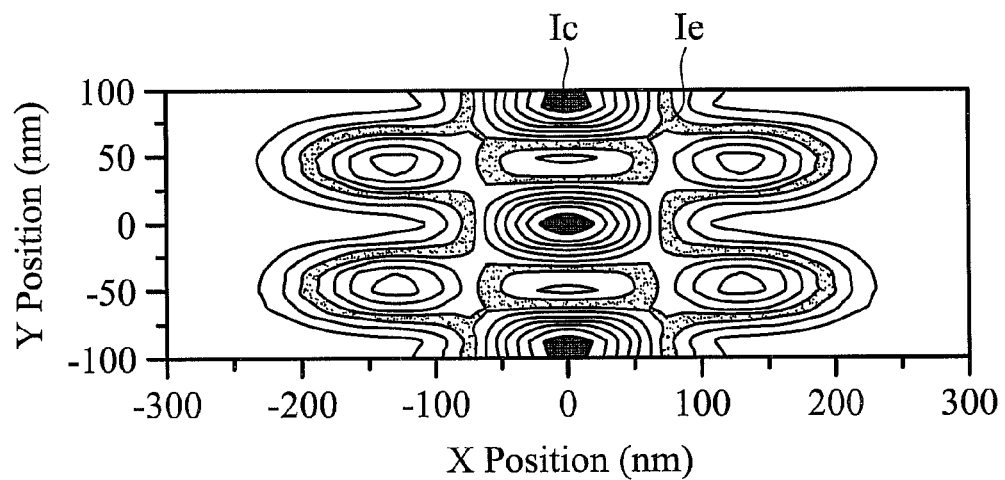
FIGS. 2A to 2E are aerial image diagrams of opening and scattering bar patterns with various edge-to-edge distances in the region A of the OPC photomask shown in FIG. 1.
Figure 2B:
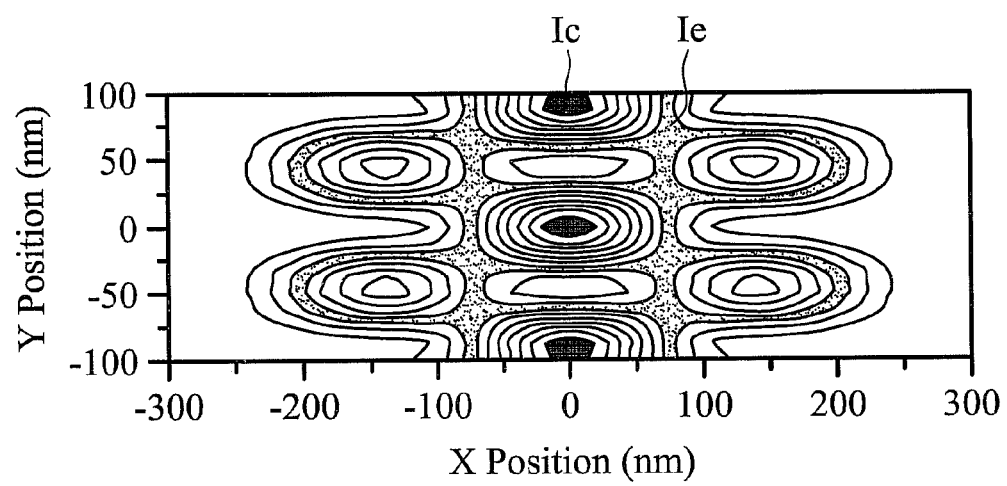
Figure 2C:
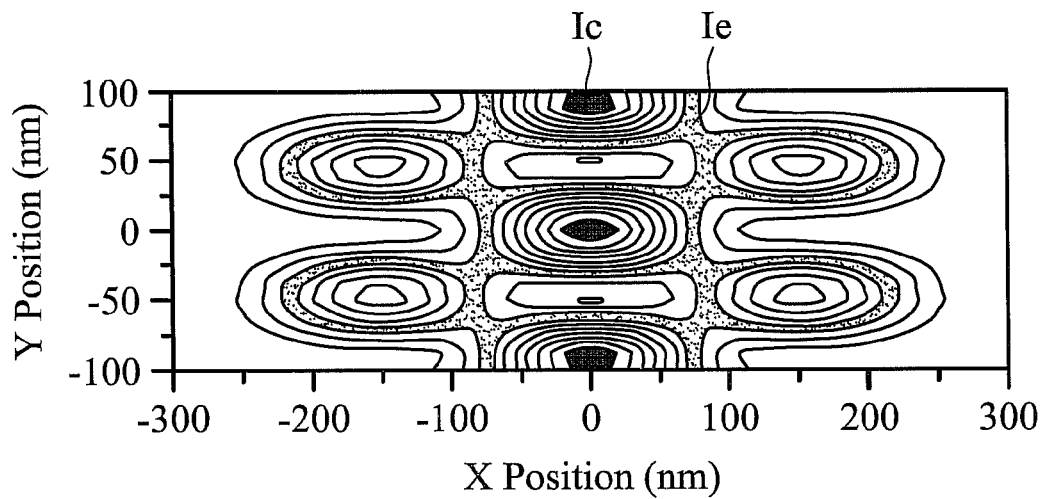
Figure 2D:
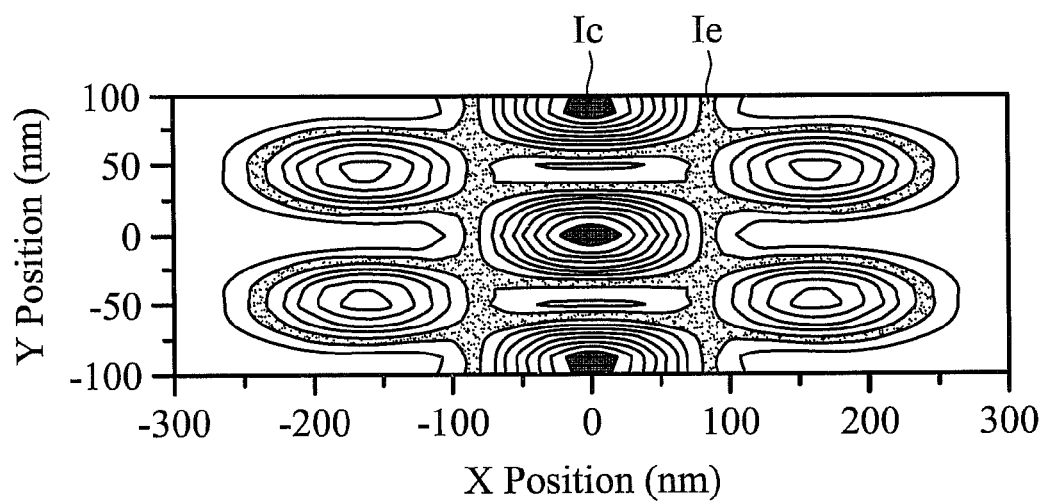
Figure 2E:
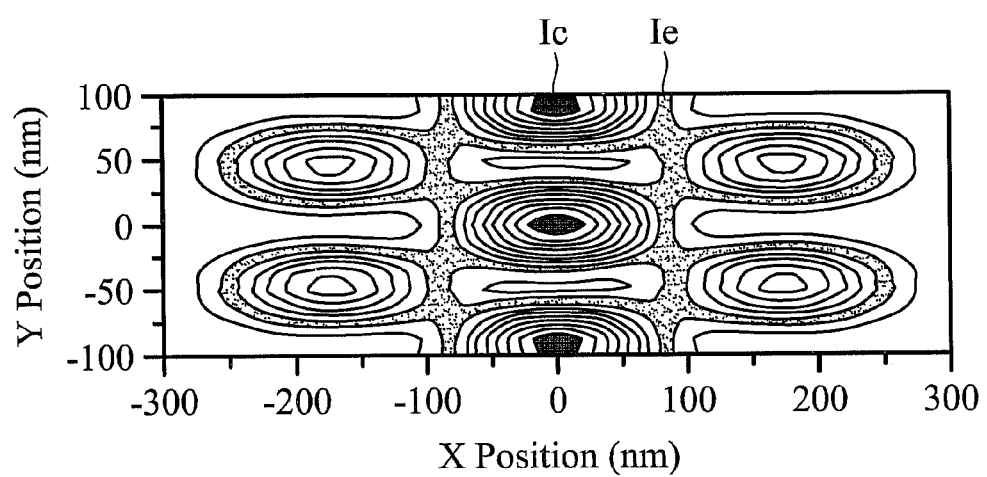

Referring to FIGS. 2A to 2E, aerial image diagrams of opening and scattering bar patterns with various edge-to-edge distances in the region A of the OPC photomask shown in FIG. 1 are illustrated, wherein no phase shift exists between the opening and scattering bar patterns. In FIG. 2A, the edge-to-edge distance (as labeled "D" shown in FIG. 1) is 0 nm (i.e., a side edge of the opening pattern 104 is aligned with that of the scattering bar pattern 106). In this case, the light intensity at the center of the opening pattern 104 (as labeled "Ic") is about 0.486, and the light intensity at the edge of the opening pattern 104 (as labeled "Ie") is about 0.178. In FIG. 2B, the edge-to-edge distance is 10 nm. In this case, the light intensity at the center of the opening pattern 104 (Ic) is about 0.478, and the light intensity at the edge of the opening pattern 104 (Ie) is about 0.131. In FIG. 2C, the edge-to-edge distance is 20 nm. In this case, the light intensity at the center of the opening pattern 104 (Ic) is about 0.472, and the light intensity at the edge of the opening pattern 104 (Ie) is about 0.129. In FIG. 2D, the edge-to-edge distance is 30 nm. In this case, the light intensity at the center of the opening pattern 104 (Ic) is about 0.466, and the light intensity at the edge of the opening pattern 104 (Ie) is about 0.086. In FIG. 2E, the edge-to-edge distance is 40 nm. In this case, the light intensity at the center of the opening pattern 104 (Ic) is about 0.461, and the light intensity at the edge of the opening pattern 104 (Ie) is about 0.086.

As shown in FIGS. 2A to 2E, the light intensity at the edge of the opening pattern 104 (Ie) can be reduced when the edge-to-edge distance is increased. However, since the light intensity at the center of the opening pattern 104 (Ic) is also reduced when the edge-to-edge distance is increased, the contrast cannot be effectively increased.

Figure 3A:
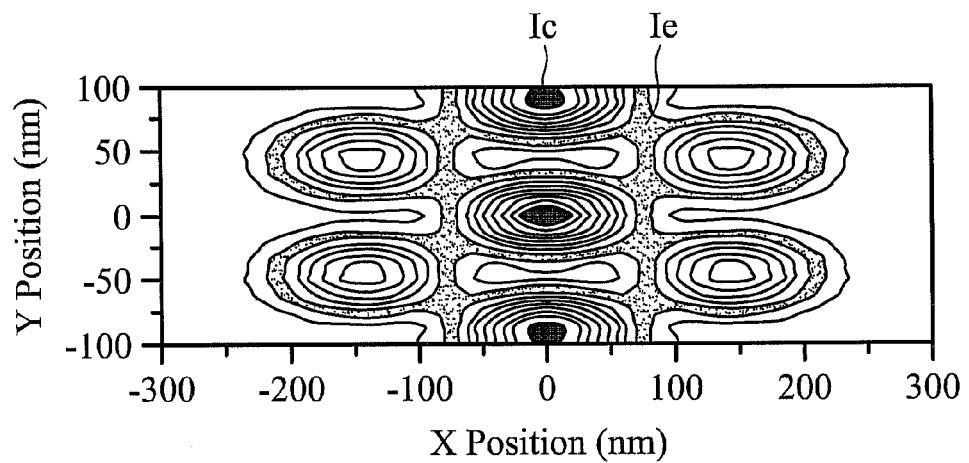
FIGS. 3A to 3E are aerial image diagrams of opening and scattering bar patterns with various edge-to-edge distances in the region A of the OPC photomask shown in FIG. 1, wherein a phase shift of 180° exists between the opening and scattering bar patterns.
Figure 3B:
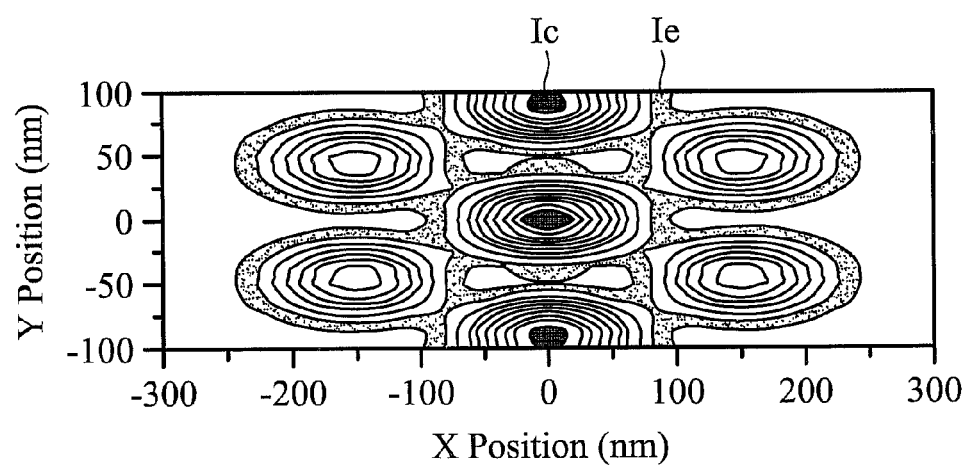
Figure 3C:
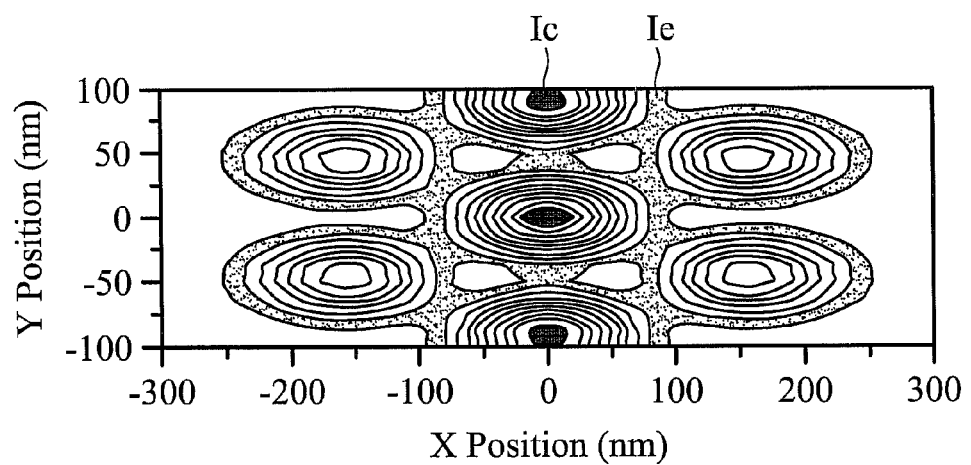
Figure 3D:
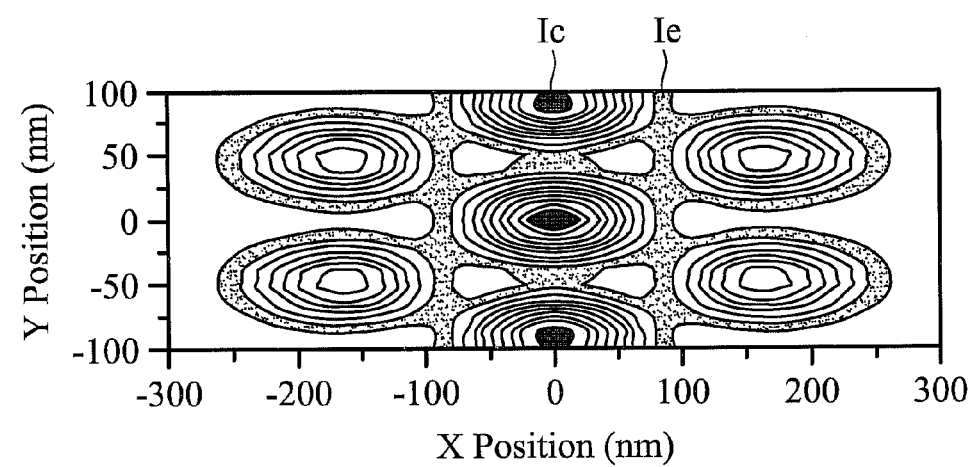
Figure 3E:
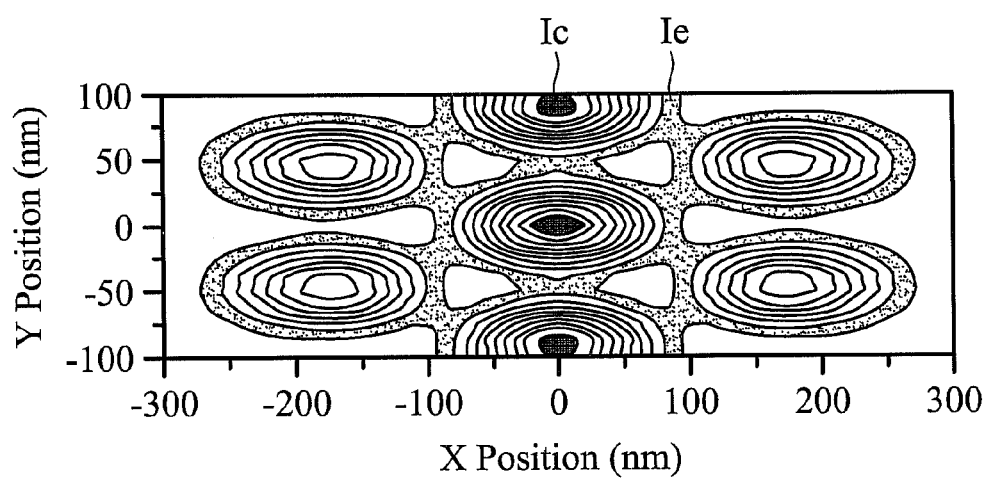

Referring to FIGS. 3A to 3E, which illustrate aerial image diagrams of opening and scattering bar patterns with various edge-to-edge distances in the region A of the OPC photomask shown in FIG. 1, wherein a phase shift of 180° exists between the opening and scattering bar patterns. In FIG. 3A, the edge-to-edge distance is 0 nm. In this case, the light intensity at the center of the opening pattern 104 (Ic) is about 0.450, and the light intensity at the edge of the opening pattern 104 (Ie) is about 0.086. In FIG. 3B, the edge-to-edge distance is 10 nm. In this case, the light intensity at the center of the opening pattern 104 (Ic) is about 0.455, and the light intensity at the edge of the opening pattern 104 (Ie) is about 0.046. In FIG. 3C, the edge-to-edge distance is 20 nm. In this case, the light intensity at the center of the opening pattern 104 (Ic) is about 0.459, and the light intensity at the edge of the opening pattern 104 (Ie) is about 0.046. In FIG. 3D, the edge-to-edge distance is 30 nm. In this case, the light intensity at the center of the opening pattern 104 (Ic) is about 0.460, and the light intensity at the edge of the opening pattern 104 (Ie) is about 0.046. In FIG. 3E, the edge-to-edge distance is 40 nm. In this case, the light intensity at the center of the opening pattern 104 (Ic) is about 0.460, and the light intensity at the edge of the opening pattern 104 (Ie) is about 0.046.

Comparing FIGS. 2A to 2E with FIGS. 3A to 3E, the light intensity at the center of the opening pattern 104 (Ic) is not reduced when the edge-to-edge distance is increased. Moreover, when a phase shift of 180° exists between the opening pattern 104 and the scattering bar pattern 106, the light intensity at the edge of the opening pattern 104 (Ie) can be further reduced, thereby increasing the contrast. Accordingly, the profile of opening pattern imprinted onto the photoresist by the OPC photomask 100 can be improved.

According to the aforementioned embodiments, since no scattering bar pattern is near the edge of each opening pattern, the process window of the OPC photomask is not reduced when the size and pitch of the opening patterns are narrowed. Moreover, since a phase shift of 180° exists between the opening pattern and the scattering bar pattern, the light intensity at the edges of the opening patterns can be reduced while the light intensity in the opening patterns themselves is not reduced, thereby improving the profile of the opening patterns transferred onto the photoresist by the photomask and increasing the contrast in the photolithography process. Additionally, since the contrast in the photolithography process is increased, the flexibility for selection of the photoresist material can be increased or the process window of the OPC photomask can be further increased.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An optical proximity correction photomask, comprising:
    two opening patterns, arranged on a substrate along a first direction and separated from each other by a predetermined distance; and
    a pair of scattering bar patterns, arranged on the substrate along a second direction perpendicular to the first direction and adjacent to two opposing sides of each opening pattern,
    wherein each scattering bar pattern does not overlap with the opening patterns on the first and second directions as viewed from a cross sectional perspective and a phase shift of 180° exists between each opening pattern and each scattering bar pattern.

2. The photomask of claim 1, wherein each opening pattern has a phase of 0° and each scattering bar pattern has a phase of 180°.

3. The photomask of claim 1, wherein each opening pattern has a phase of 180° and each scattering bar pattern has a phase of 0°.

4. The photomask of claim 1, wherein each opening pattern is rectangular and has a long edge parallel to a long edge of each scattering bar pattern and the second direction.

5. The photomask of claim 1, wherein a ratio of a width of each scattering bar pattern to the predetermined distance does not exceed 0.5.

6. The photomask of claim 1, wherein the opening patterns and each scattering bar pattern are arranged to define an edge-to-edge distance in a range of 0 to 80 nm.

7. An optical proximity correction photomask, comprising:
    a plurality of rectangular opening patterns, arranged on a substrate along a first direction to define a plurality of spacing regions therebetween; and
    a plurality of pairs of scattering bar patterns, respectively arranged on the substrate along a second direction perpendicular to the first direction, such that each pair of scattering bar patterns is adjacent to two opposing sides of a corresponding spacing region,
    wherein each scattering bar pattern does not overlap with the plurality of rectangular opening patterns on the first and second directions as viewed from a cross sectional perspective and a phase shift of 180° exists between each rectangular opening pattern and each scattering bar pattern.

8. The photomask as claimed in claim 7, wherein each rectangular opening pattern has a long edge parallel to a long edge of each scattering bar pattern and the second direction.

9. The photomask of claim 7, wherein the plurality of opening patterns and each scattering bar pattern are arranged to define an edge-to-edge distance in a range of 0 to 80 nm.

10. The photomask of claim 7, wherein each spacing region has a width extending along the first direction, and a ratio of a width of each scattering bar pattern to the width of each spacing region does not exceed 0.5.

* * * * *